(12) United States Patent
Xue et al.

(10) Patent No.: US 7,788,620 B1
(45) Date of Patent: Aug. 31, 2010

(54) INPUT/OUTPUT PLACEMENT SYSTEMS AND METHODS TO REDUCE SIMULTANEOUS SWITCHING OUTPUT NOISE

(75) Inventors: Hua Xue, Saratoga, CA (US); Bertrand Leigh, Portland, OR (US); Ju Shen, San Jose, CA (US); Chris West, Portland, OR (US); Mike Ray, Portland, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 433 days.

(21) Appl. No.: 11/937,328

(22) Filed: Nov. 8, 2007

Related U.S. Application Data

(60) Provisional application No. 60/886,047, filed on Jan. 22, 2007, provisional application No. 60/886,055, filed on Jan. 22, 2007, provisional application No. 60/896,066, filed on Mar. 21, 2007.

(51) Int. Cl.
G06F 17/50 (2006.01)
(52) U.S. Cl. .......................... 716/10; 716/6
(58) Field of Classification Search ............... 716/6, 716/10, 15
See application file for complete search history.

(56) References Cited

U.S. PATENT DOCUMENTS

| | | | |
|---|---|---|---|
| 5,477,460 A | 12/1995 | Vakirtzis | |
| 6,564,355 B1 | 5/2003 | Smith | |
| 6,788,098 B1 | 9/2004 | Alani et al. | |
| 7,055,113 B2 | 5/2006 | Broberg, III et al. | |
| 7,111,265 B1 * | 9/2006 | Tan et al. | 716/10 |
| 7,135,895 B2 | 11/2006 | Komura | |
| 7,139,691 B1 | 11/2006 | Duong | |
| 7,299,439 B1 * | 11/2007 | Slonim et al. | 716/10 |
| 7,299,444 B1 * | 11/2007 | Tai et al. | 716/16 |
| 7,412,673 B1 * | 8/2008 | Duong | 716/4 |
| 7,523,430 B1 * | 4/2009 | Patel | 716/10 |
| 2003/0039401 A1 | 2/2003 | Gallagher | |
| 2004/0015803 A1 * | 1/2004 | Huang et al. | 716/10 |
| 2008/0027662 A1 | 1/2008 | Kouzaki | |
| 2008/0109780 A1 * | 5/2008 | Stern et al. | 716/11 |
| 2009/0210846 A1 * | 8/2009 | Lindberg et al. | 716/11 |

OTHER PUBLICATIONS

Williamson, John M., et al., "Ground noise minimization in integrated circuit packages through pin assignment optimization", May 1996. IEEE. pp. 361-371.*
Mak, Wai-Kei, "On Constrainedpin-mapping for FPGA-PCB Codesign", Dec. 2006. IEEE. pp. 2393-2401.*
Mak, Wai-Kei, "Modern FPGA constrained placement", 2005. pp. 779-784.*
Hauck, Scott, et al., "Pin assignment for multi-fpga systems", 1995. IEEE Design Automation Confernce. pp. 1-14.*
Rutenbar, Rob, "Simulated annealing algorithms: an overview", Jan. 1989. IEEE. pp. 19-26.*

* cited by examiner

Primary Examiner—Stacy A Whitmore
(74) Attorney, Agent, or Firm—Haynes and Boone, LLP

(57) ABSTRACT

Systems and methods provide I/O signal placement algorithms, such as for a programmable logic device. For example, a performing input/output (I/O) signal placement to pins of an electronic device, in accordance with an embodiment, includes placing all pre-assigned I/O signals to their assigned pin locations; placing unassigned I/O signals to initial I/O pin locations; and performing a simulated annealing for the I/O signals placed at initial I/O pin locations, wherein the simulated annealing accounts for simultaneous switching output (SSO) noise requirements.

19 Claims, 8 Drawing Sheets

Table 1: 1st Data Table with Measured Data in Bold and Other Data Points Extrapolated I/O type= LVCMOS33    Slew=Fast    Load=15pF    VCCIO= 3.46V

| SSO/Drive | 1st Data Group | | | | | | | 2nd Data Group | | | | | | | | | 3rd Data Group | | | | | | | | | | |
|---|---|---|---|---|---|---|---|---|---|---|---|---|---|---|---|---|---|---|---|---|---|---|---|---|---|---|---|
| | IO1 | IO2 | IO3 | IO4 | IO5 | IO6 | IO7 | IO8 | IO9 | IO10 | IO11 | IO12 | IO13 | IO14 | IO15 | IO16 | IO17 | IO18 | IO19 | IO20 | IO21 | IO22 | IO23 | IO24 | IO25 | IO26 | IO27 |
| n/a | n/a | n/a | n/a | n/a | n/a | n/a | n/a | n/a | n/a | n/a | n/a | n/a | n/a | n/a | n/a | n/a | n/a | n/a | n/a | n/a | n/a | n/a | n/a | n/a | n/a | n/a | n/a |
| 4 | 24 | 48 | 60 | 72 | 83.5 | 95 | 106.5 | 118 | 127.6 | 137.3 | 146.9 | 156.5 | 166.1 | 175.8 | 185.4 | 195 | 200.6 | 206.2 | 211.8 | 217.4 | 222.9 | 228.5 | 234.1 | 239.7 | 245.3 | 250.9 | 256.5 |
| 8 | 48 | 96 | 120 | 144 | 167 | 190 | 213 | 236 | 255.3 | 274.5 | 293.8 | 313 | 332.3 | 351.5 | 370.8 | 390 | 401.2 | 412.4 | 423.5 | 434.7 | 445.9 | 457.1 | 468.2 | 479.4 | 490.6 | 501.8 | 512.9 |
| 12 | 62 | 124 | 167 | 210 | 242.3 | 274.5 | 306.8 | 339 | 369 | 399 | 429 | 459 | 489 | 519 | 549 | 579 | 593.8 | 608.5 | 623.3 | 638.1 | 652.8 | 667.6 | 682.4 | 697.1 | 711.9 | 726.6 | 741.4 |
| 16 | 76 | 152 | 214 | 276 | 317.5 | 359 | 400.5 | 442 | 482.8 | 523.5 | 564.3 | 605 | 645.8 | 686.5 | 727.3 | 768 | 786.4 | 804.7 | 823.1 | 841.4 | 859.8 | 878.1 | 896.5 | 914.8 | 933.2 | 951.5 | 969.9 |
| 20 | 90 | 180 | 261 | 342 | 392.8 | 443.5 | 494.3 | 545 | 596.5 | 648 | 699.5 | 751 | 802.5 | 854 | 905.5 | 957 | 978.9 | 1001 | 1023 | 1045 | 1067 | 1089 | 1111 | 1133 | 1154 | 1176 | 1198 |

Table 2: Additional Data Table for Slew Rate Variation From Table 1

I/O type= LVCMOS33    Slew=Slow    Load=15pF    VCCIO= 3.46V

| SSO/Drive | 1st Data Group | | | | | | | 2nd Data Group | | | | | | | | | 3rd Data Group | | | | | | | | | | |
|---|---|---|---|---|---|---|---|---|---|---|---|---|---|---|---|---|---|---|---|---|---|---|---|---|---|---|---|
| | IO1 | IO2 | IO3 | IO4 | IO5 | IO6 | IO7 | IO8 | IO9 | IO10 | IO11 | IO12 | IO13 | IO14 | IO15 | IO16 | IO17 | IO18 | IO19 | IO20 | IO21 | IO22 | IO23 | IO24 | IO25 | IO26 | IO27 |
| n/a | n/a | n/a | n/a | n/a | n/a | n/a | n/a | n/a | n/a | n/a | n/a | n/a | n/a | n/a | n/a | n/a | n/a | n/a | n/a | n/a | n/a | n/a | n/a | n/a | n/a | n/a | n/a |
| 4 | 6 | 12 | 13.5 | 15 | 16.25 | 17.5 | 18.75 | 20 | 21.38 | 22.75 | 24.13 | 25.5 | 26.88 | 28.25 | 29.63 | 31 | 31.53 | 32.06 | 32.59 | 33.12 | 33.65 | 34.18 | 34.71 | 35.24 | 35.76 | 36.29 | 36.82 |
| 8 | 12 | 24 | 27 | 30 | 32.5 | 35 | 37.5 | 40 | 42.75 | 45.5 | 48.25 | 51 | 53.75 | 56.5 | 59.25 | 62 | 63.06 | 64.12 | 65.18 | 66.24 | 67.29 | 68.35 | 69.4 | 70.47 | 71.53 | 72.59 | 73.65 |
| 12 | 30 | 60 | 77.5 | 95 | 113.3 | 131.5 | 149.8 | 168 | 178.9 | 189.8 | 200.6 | 211.5 | 222.4 | 233.3 | 244.1 | 255 | 260.9 | 266.9 | 272.8 | 278.8 | 284.7 | 290.6 | 296.6 | 302.5 | 308.5 | 314.4 | 320.4 |
| 16 | 48 | 96 | 128 | 160 | 194 | 228 | 262 | 296 | 315 | 334 | 353 | 372 | 391 | 410 | 429 | 448 | 458.8 | 469.6 | 480.5 | 491.3 | 502.1 | 512.9 | 523.8 | 534.6 | 545.4 | 556.2 | 567.1 |
| 20 | 66 | 132 | 178.5 | 225 | 274.8 | 324.5 | 374.3 | 424 | 451.1 | 478.3 | 505.4 | 532.5 | 559.6 | 586.8 | 613.9 | 641 | 656.7 | 672.4 | 688.1 | 703.8 | 719.5 | 735.2 | 750.9 | 766.6 | 782.4 | 798.1 | 813.8 |

| FIG. 2b1 |
|---|
| FIG. 2b2 |

Key To FIG. 2b

FIG. 2b1

Table 3: Additional Data Table for Cap. Load Variation From Table 1

I/O type= LVCMOS33  Slew=Fast  Load=5pF  VCCIO= 3.46V

| SSO/Drive | 1st Data Group | | | | | | | 2nd Data Group | | | | | | | | 3rd Data Group | | | | | | | | | |
|---|---|---|---|---|---|---|---|---|---|---|---|---|---|---|---|---|---|---|---|---|---|---|---|---|---|
| | IO1 | IO2 | IO3 | IO4 | IO5 | IO6 | IO7 | IO8 | IO9 | IO10 | IO11 | IO12 | IO13 | IO14 | IO15 | IO16 | IO17 | IO18 | IO19 | IO20 | IO21 | IO22 | IO23 | IO24 | IO25 | IO26 | IO27 |
| n/a | n/a | n/a | n/a | n/a | n/a | n/a | n/a | n/a | n/a | n/a | n/a | n/a | n/a | n/a | n/a | n/a | n/a | n/a | n/a | n/a | n/a | n/a | n/a | n/a | n/a | n/a |
| 4 | 17 | 34 | 47 | 60 | 74.25 | 88.5 | 102.8 | 117 | 126.1 | 135.3 | 144.4 | 153.5 | 162.6 | 171.8 | 180.9 | 190 | 194.4 | 198.7 | 203.1 | 207.4 | 211.8 | 216.1 | 220.5 | 224.8 | 229.2 | 233.5 | 237.9 |
| 8 | 34 | 68 | 94 | 120 | 148.5 | 177 | 205.5 | 234 | 252.3 | 270.5 | 288.8 | 307 | 325.3 | 343.5 | 361.8 | 380 | 388.7 | 397.4 | 406.1 | 414.8 | 423.5 | 432.2 | 440.9 | 449.6 | 458.4 | 467.1 | 475.8 |
| 12 | 59.5 | 119 | 151.5 | 184 | 192.5 | 201 | 209.5 | 218 | 237.3 | 256.5 | 275.8 | 295 | 314.3 | 333.5 | 352.8 | 372 | 381.5 | 391 | 400.6 | 410.1 | 419.6 | 429.2 | 438.7 | 448.2 | 457.8 | 467.3 | 476.8 |
| 16 | 85 | 170 | 209 | 248 | 236.5 | 225 | 213.5 | 202 | 222.3 | 242.5 | 262.8 | 283 | 303.3 | 323.5 | 343.8 | 364 | 374.4 | 384.7 | 395.1 | 405.4 | 415.8 | 426.1 | 436.5 | 446.8 | 457.2 | 467.5 | 477.9 |
| 20 | 110.5 | 221 | 266.5 | 312 | 280.5 | 249 | 217.5 | 186 | 207.3 | 228.5 | 249.8 | 271 | 292.3 | 313.5 | 334.8 | 356 | 367.2 | 378.4 | 389.5 | 400.7 | 411.9 | 423.1 | 434.2 | 445.4 | 456.6 | 467.8 | 478.9 |

Table 4: Additional Data Table for VCCIO Variation From Table 1

I/O type= LVCMOS25  Slew=Fast  Load=15pF  VCCIO= 2.63V

| SSO/Drive | 1st Data Group | | | | | | | 2nd Data Group | | | | | | | | 3rd Data Group | | | | | | | | | |
|---|---|---|---|---|---|---|---|---|---|---|---|---|---|---|---|---|---|---|---|---|---|---|---|---|---|
| | IO1 | IO2 | IO3 | IO4 | IO5 | IO6 | IO7 | IO8 | IO9 | IO10 | IO11 | IO12 | IO13 | IO14 | IO15 | IO16 | IO17 | IO18 | IO19 | IO20 | IO21 | IO22 | IO23 | IO24 | IO25 | IO26 | IO27 |
| n/a | n/a | n/a | n/a | n/a | n/a | n/a | n/a | n/a | n/a | n/a | n/a | n/a | n/a | n/a | n/a | n/a | n/a | n/a | n/a | n/a | n/a | n/a | n/a | n/a | n/a | n/a |
| 4 | 26.2 | 52.42 | 61.17 | 69.91 | 80.73 | 91.55 | 102.4 | 113.2 | 120.2 | 127.2 | 134.2 | 141.1 | 148.1 | 155.1 | 162.1 | 169.1 | 173.6 | 178.1 | 182.7 | 187.2 | 191.7 | 196.2 | 200.8 | 205.3 | 209.8 | 214.3 | 218.8 |
| 8 | 52.42 | 104.8 | 122.3 | 139.8 | 161.5 | 183.1 | 204.7 | 226.4 | 240.4 | 254.3 | 268.3 | 282.3 | 296.3 | 310.2 | 324.2 | 338.2 | 347.2 | 356.3 | 365.3 | 374.4 | 383.4 | 392.5 | 401.5 | 410.5 | 419.6 | 428.6 | 437.7 |
| 12 | 67.71 | 135.4 | 169.7 | 203.9 | 234.2 | 264.6 | 294.9 | 325.2 | 347.3 | 369.4 | 391.5 | 413.6 | 435.8 | 457.9 | 480 | 502.1 | 514 | 525.8 | 537.7 | 549.6 | 561.5 | 573.3 | 585.2 | 597.1 | 609 | 620.8 | 632.7 |
| 16 | 83 | 166 | 217 | 268 | 307 | 346 | 385 | 424 | 454.3 | 484.5 | 514.8 | 545 | 575.3 | 605.5 | 635.8 | 666 | 680.7 | 695.4 | 710.1 | 724.8 | 739.5 | 754.2 | 768.9 | 783.6 | 798.4 | 813.1 | 827.8 |
| 20 | 98.29 | 196.6 | 264.3 | 332.1 | 379.8 | 427.4 | 475.1 | 522.8 | 561.2 | 599.6 | 638 | 676.4 | 714.7 | 753.1 | 791.5 | 829.9 | 847.4 | 865 | 882.5 | 900 | 917.6 | 935.1 | 952.7 | 970.2 | 987.7 | 1005 | 1023 |

FIG. 2b2

SSO Total = SSO IO_A + SSO IO_B + SSO IO_C
In this example SSO IO_A, SSO IO_B, SSO IO_C all have 1 IO switching

SSO Noise Curve for the Non Ideal Case

Non Ideal FPGA data

|  | I01 | I02 | I03 | I04 | I05 | I06 |
|---|---|---|---|---|---|---|
| IOStandardA | 4 | 6 | 9 | 11 | 12 | 12.5 |
| IOStandardB | 3 | 5.5 | 6.5 | 9.5 | 10.5 | 10.5 |
| IOStandardC | 2 | 3 | 4 | 5 | 7 | 7.5 |

502

Test Case uses 2 IO StandardA, 2 IO StandardB, and 2 IO StandardC

506

Result

| Noise_A | 6 |
|---|---|
| Noise_B | 4 |
| Noise_C | 2.5 |
| Noise Total | 12.5 |

504

Conventional Algorithm
SSO Noise Delta for adding an IO

|  | I01 | I02 | I03 | I04 | I05 | I06 |
|---|---|---|---|---|---|---|
| IOStandardA | 4 | 2 | 3 | 2 | 1 | 0.5 |
| IOStandardB | 3 | 2.5 | 1 | 3 | 1 | 0 |
| IOStandardC | 2 | 1 | 1 | 1 | 2 | 0.5 |

510

Result

| Max Noise I01 | 4 |
|---|---|
| Max Noise I02 | 2.5 |
| Max Noise I03 | 3 |
| Max Noise I04 | 3 |
| Max Noise I05 | 2 |
| Max Noise I06 | 0.5 |
| Noise Total | 15 |

508

New Algorithm
SSO Noise Delta for adding an IO

|  | I01 | I02 | I03 | I04 | I05 | I06 |
|---|---|---|---|---|---|---|
| IOStandardA | 4 | 2 | 3 | 2 | 1 | 0.5 |
| IOStandardB | 3 | 2.5 | 1 | 3 | 1 | 0 |
| IOStandardC | 2 | 1 | 1 | 1 | 2 | 0.5 |

FIG. 5a

INPUT/OUTPUT PLACEMENT SYSTEMS AND METHODS TO REDUCE SIMULTANEOUS SWITCHING OUTPUT NOISE

CROSS-REFERENCE TO RELATED APPLICATIONS

This application is related to and claims priority to U.S. Provisional Patent Application No. 60/886,047, filed Jan. 22, 2007, U.S. Provisional Patent Application No. 60/886,055, filed Jan. 22, 2007, and U.S. Provisional Patent Application No. 60/896,066, filed Mar. 21, 2007, which are incorporated herein by reference in their entirety.

TECHNICAL FIELD

The present invention relates generally to electrical circuits and design software and, more particularly, to techniques directed to simultaneous switching output noise.

BACKGROUND

As processing and packaging technologies continue to advance to support smaller geometries and higher speed input/output (I/O) signal applications, simultaneous switching output (SSO) noise is becoming a significant issue for electronic devices such as programmable logic devices (PLDs) designs. While various techniques may be used by a PLD manufacturer to reduce SSO noise, such as by employing a more expensive package (e.g., a flip chip package), SSO noise is generally still perceived as a PLD design issue, with the PLD design engineer typically tasked with dealing with SSO noise design problems.

Conventional approaches generally fail to provide adequate design tools that address SSO noise (also referred to as ground bounce voltage) for a given PLD design. For example, a conventional approach may fail to adequately predict or estimate the SSO noise and/or adequately address SSO noise during the PLD design process (e.g., for design optimization, map, place, and route). Consequently, the PLD design engineer may employ a SSO design check tool (e.g., provided by a vendor), after the I/O signal assignments (e.g., after the design fitting process), to determine if SSO noise may be an issue for the PLD design. However, this conventional approach typically results in a tedious and time-consuming trial-and-error process.

As a result, there is a need for improved techniques directed to simultaneous switching output noise, such as for the PLD design process.

SUMMARY

In accordance with one embodiment of the present invention, a method of performing input/output (I/O) signal placement to pins of an electronic device includes placing all pre-assigned I/O signals to their assigned pin locations; placing unassigned I/O signals to initial I/O pin locations; and performing a simulated annealing for the I/O signals placed at initial I/O pin locations, wherein the simulated annealing accounts for simultaneous switching output (SSO) noise requirements.

In accordance with another embodiment of the present invention, a computer-readable medium on which is stored a computer program for performing a method of input/output (I/O) signal placement to pins of an electronic device includes placing all pre-assigned I/O signals to their assigned pin locations; placing unassigned I/O signals to initial I/O pin locations; and performing a simulated annealing for the I/O signals placed at initial I/O pin locations, wherein the simulated annealing accounts for simultaneous switching output (SSO) noise requirements.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIG. 2b shows a number of tables illustrating examples of data structures in accordance with an embodiment of the present invention.

FIG. 5a shows a number of tables illustrating an example of SSO noise data and SSO noise calculations in accordance with an embodiment of the present invention.

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
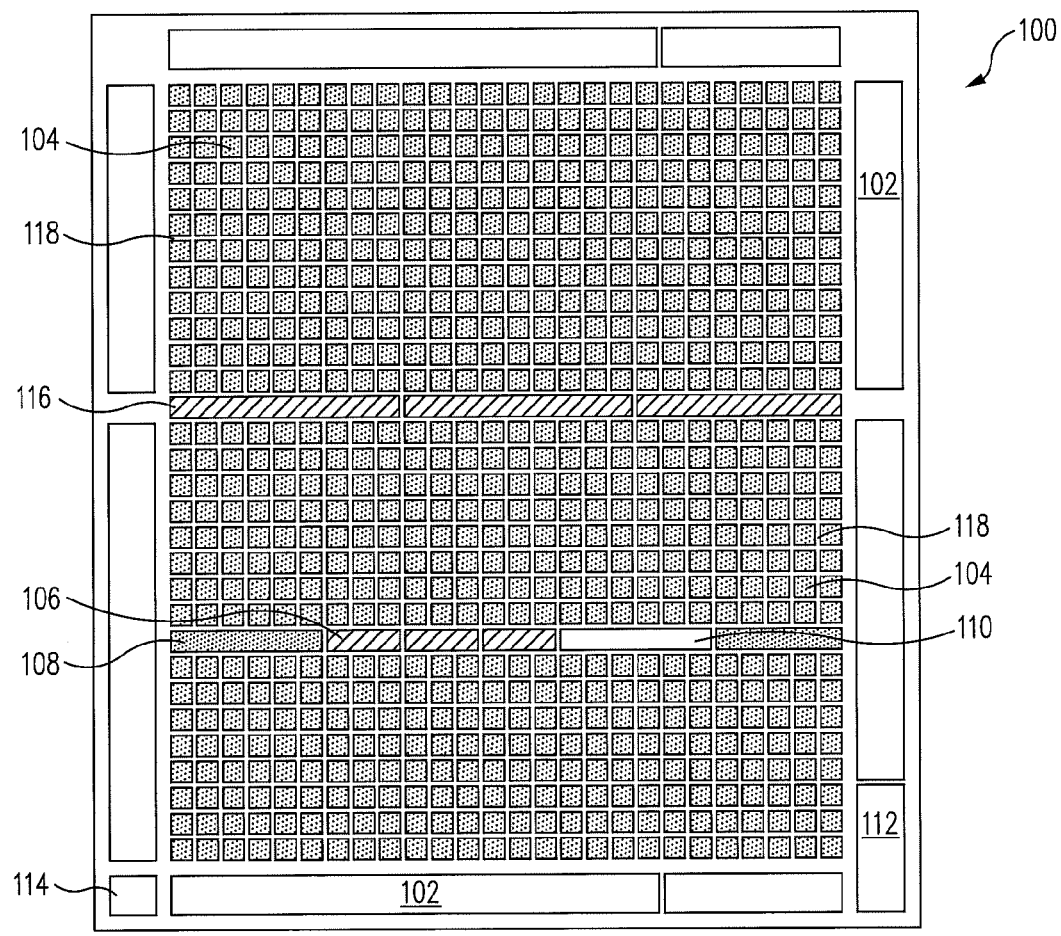
FIG. 1 shows a block diagram illustrating an example of a programmable logic device in accordance with an embodiment of the present invention.

FIG. 1 shows a block diagram illustrating a programmable logic device (PLD) 100 in accordance with an embodiment of the present invention. PLD 100 (e.g., a field programmable gate array (FPGA), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)). I/O blocks 102 provide I/O functionality (e.g., supports one or more I/O signal and/or memory interface standards) for PLD 100, while programmable logic blocks 104 provide logic functionality (e.g., LUT-based logic or logic gate array-based logic) for PLD 100.

PLD 100 may also include blocks of memory 106 (e.g., blocks of EEPROM, block SRAM, and/or flash memory), clock-related circuitry 108 (e.g., PLL and/or DLL circuits), configuration logic 110 (e.g., for startup, decryption, encryption, multiple-boot support (e.g., dual boot support), and/or error detection), a configuration port 112, configuration memory 114, special function blocks 116 (e.g., DSP blocks or other forms of multiply and accumulate circuit functionality), and/or routing resources 118. In general, the various elements of PLD 100 may be used to perform their intended functions for the desired application, as would be understood by one skilled in the art.

For example, configuration port 112 may be used for programming PLD 100, such as memory 106 and/or configuration memory 114 or transferring information (e.g., various types of data and/or control signals) to/from PLD 100 as would be understood by one skilled in the art. For example, configuration port 112 may include a first programming port (which may represent a central processing unit (CPU) port, a peripheral data port, a serial peripheral interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). Configuration port 112 typically, for example, may be included to receive configuration data and commands to support serial or parallel device configuration and information transfer.

It should be understood that the number and placement of the various elements, such as I/O blocks 102, logic blocks 104, memory 106, clock-related circuitry 108, configuration logic 110, configuration port 112, configuration memory 114, special function blocks 116, and routing resources 118, are not limiting and may depend upon the desired application. For example, special function blocks 116 are optional and various other elements may not be required for a desired application or design specification (e.g., for the type of programmable device selected).

Furthermore, it should be understood that the elements are illustrated in block form for clarity and that certain elements, such as for example configuration memory 114 or routing resources 118, would typically be distributed throughout PLD 100, such as in and between logic blocks 104, to perform their conventional functions (e.g., storing configuration data that configures PLD 100 or providing interconnect structure within PLD 100, respectively). It should also be understood that the various embodiments of the present invention as disclosed herein are not limited to programmable logic devices, such as PLD 100, and may be applied to various other types of programmable devices, as would be understood by one skilled in the art.

As noted previously, conventional approaches generally fail to provide automated design tools to address SSO noise to provide, for example, data collection, data structure, and/or SSO noise calculations (e.g., a worst case SSO noise prediction calculation), which may be used for example to optimize I/O signal assignments during the design process and avoid tedious and time-consuming trial-and-error processes. For example, a conventional approach may attempt to provide SSO data for a specific package (e.g., a BGA package) for different I/O signal types, but typically fails to specify techniques for structuring the data for automated calculation techniques (e.g., a data structure for building an SSO predictor/estimator with direct calculation techniques). Furthermore as an example, a conventional approach generally does not address the SSO issue during the design fitting process (e.g., such as an algorithm that considers SSO noise issues during the placement and routing stage of the design for the particular PLD).

In accordance with one or more embodiments of the present invention, systems and methods are disclosed to provide an SSO noise estimator using SSO data collection techniques and SSO data structure techniques to collect and organize the data to estimate the SSO noise. As a specific example, the SSO data collection technique may outline comprehensive data collection techniques for the hardware (i.e., device hardware, such as the PLD circuitry, pins, and/or packaging) and may further use simulations to supplement the hardware data collection. As a further example, after the data is collected, the SSO data structure technique may outline comprehensive data structure techniques to organize the data for estimation.

Thus for this specific embodiment, the SSO data collection and SSO data structure techniques may replace or supplement conventional approaches (e.g., BGA package worst case data collection and data addition techniques for different I/O signal types) to develop a comprehensive SSO noise estimator. Consequently using the techniques disclosed herein, this SSO noise estimator technique may be integrated into a PLD (e.g., an FPGA) design tool for SSO noise estimation, which may be used during the placement and routing stage of the PLD design as described further herein.

For the SSO data collection technique, as a specific example in accordance with one or more embodiments, a worst case data collection technique may include selection of the worst-case victim pin based on a relative location of the victim pin to the nearest pins for supply voltage (e.g., VCC or VCCIO) and ground voltage (e.g., GND). In general, the selection of victim pin will be different for different package types.

As an example in accordance with an embodiment, an on-die pin selection technique is disclosed, which may be applied for wire-bond leaded packages (e.g., TQFP, PQFP, or QFN packages). Specifically for ground bounce for example, the worst-case victim pin may be the pin farthest away from the two adjacent ground voltage (GND) pads within the I/O bank (e.g., of I/O block 102). Specifically for supply voltage (VCC) droop for example, the worst-case victim pin may be the pin farthest away from the two adjacent supply voltage (VCCIO) pads within the I/O bank (e.g., of I/O block 102).

As an example in accordance with an embodiment, a package location dependent pin selection technique is disclosed, which may be applied for packages where cross-talk contribution may dominate the SSO noise (e.g., such as for a BGA package). Specifically for example, because the package cross-talk may be dependent on the package substrate layout, the base line SSO noise data may be collected based on the on-die pin selection technique disclosed herein. This data can then be de-rated based on a single instance, worst case, package location dependent pin selection.

Therefore, this technique may drive the consistency from the viewpoint of the on-die pin location rather than the package dependent pin location. In general, for example, the package dependent pin location does not have any consistency for SSO pin assignments, because the package substrates are defined based on the electrical requirements of each individual pin and not from the standpoint of making the pins consistent from the SSO viewpoint.

In accordance with an embodiment of the present invention, simulation data may be used to supplement the hardware data. For example, because it is typically impractical to measure all of the required SSO noise data, simulation data may be used to first correlate with the initial hardware data. Then, once the correlation is established, simulation data may be used to generate and fill in any remaining required data fields (e.g., for the SSO noise estimator technique).

Figure 2A:
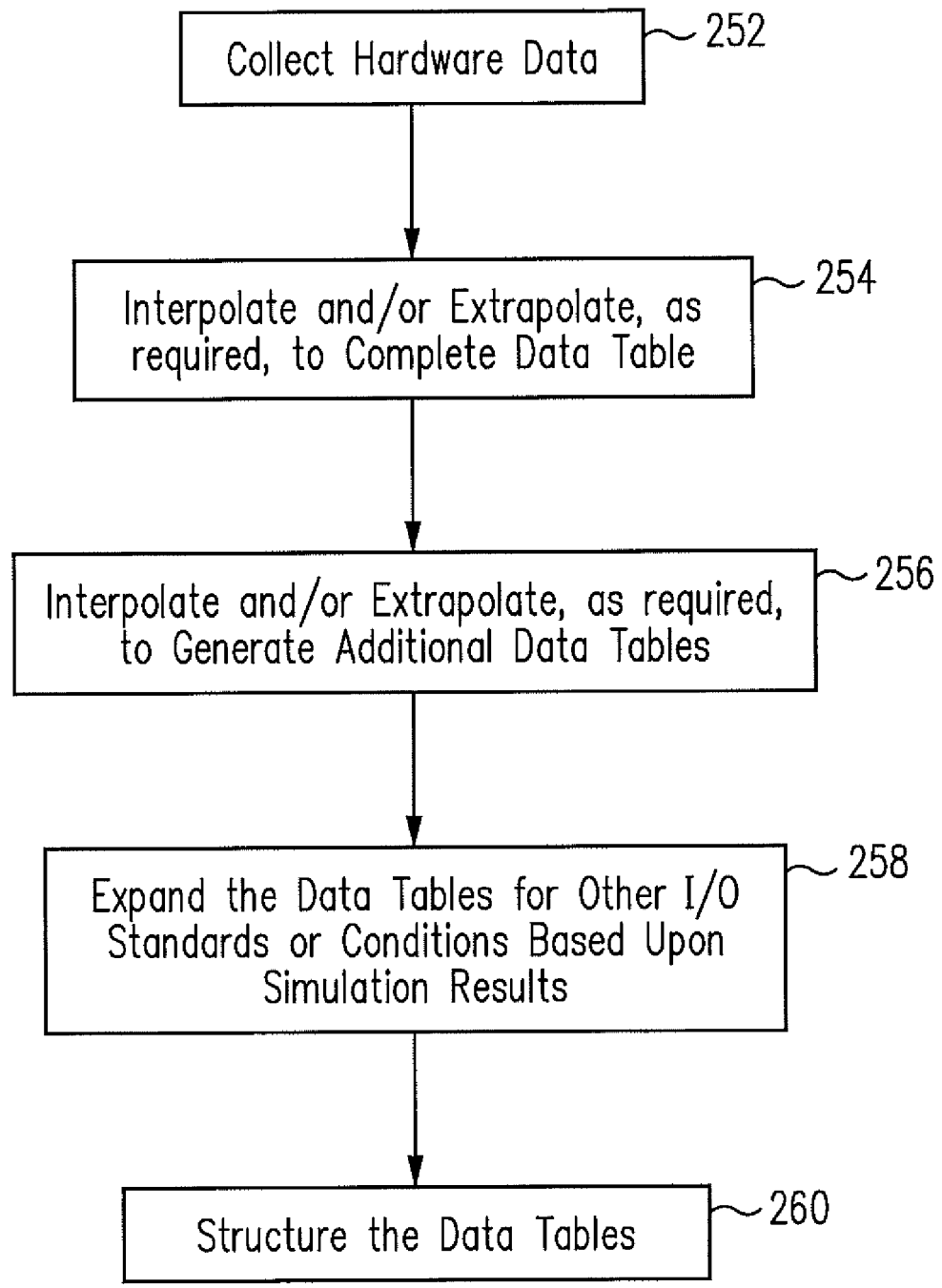
FIG. 2a shows a flowchart illustrating data collection and data structure operations in accordance with an embodiment of the present invention.

For the SSO data structure technique, as a specific example in accordance with one or more embodiments, a data table population method is disclosed (e.g., a five operation process), such as for example as set forth in flowchart form in FIG. 2a. First, hardware data is collected on initial SSO noise conditions (block 252 of FIG. 2a). For example, the initial condition may include the number of switching outputs, the output drive current, the supply voltage (VCCIO, determined by I/O type), the output slew rate, and the capacitive loading. Second, the hardware data points may be interpolated or extrapolated (block 254) from the hardware measurements for a given data table (e.g., directly or based upon simulation results).

Third, additional data tables may be generated by interpolating the initial data tables (block 256). As an example, FIG. 2b shows a number of tables that illustrate data structure examples in accordance with an embodiment of the present invention. The exemplary data values within the tables are shown with measured data values in bold relative to the remaining data values determined (e.g., directly or based upon simulation results) by interpolation and/or extrapolation. It should be understood, however, that these remaining data values may be determined as needed (e.g., on the fly to generate values as required for calculations, such as those described further herein) rather than generated and stored in tables for later use, as would be understood by one skilled in the art. Thus, storage requirements may be reduced by determining the remaining values as needed rather than determining and storing for possible later use.

For example for the tables, FIG. 2b includes a first data table (Table 1) based upon a first set of exemplary parameters (e.g., I/O type, slew speed, load, and VCCIO), a second data table (Table 2) based upon a different slew speed relative to the first data table, a third data table (Table 3) based upon a different load relative to the first data table, and a fourth data table (Table 4) based upon a different supply voltage (VCCIO) relative to the first data table. Thus as an interpolation example, if a 10 pF load condition is required, a 15 pF data table (e.g., Table 1 of FIG. 2b) and a 5 pf data table (e.g., Table 3 of FIG. 2b) may be used to generate a 10 pF data table. In general, interpolated data should be verified with hardware data.

Fourth, once the initial set of data tables is complete, simulation results may be used to expand the data tables for other I/O signal standards or conditions (block 258). Fifth, the data table (e.g., Tables 1-4 as shown in FIG. 2b) may be structured (block 260), for example, as a number of SSO switching pins on the top row (e.g., I/O 1 through I/O 27) and drive current on the first column (e.g., 4, 8, 12, 16, and 20). The SSO switching pins may also be grouped as a 1st Data Group, a 2nd Data Group, a 3rd Data Group, etc., as shown in FIG. 2b. These data groups may be used, for example, to assist in the organization of the data relative to the particular hardware characteristic. For example, the number of SSO switching pins per group may be determined by the particular hardware SSO characteristic. Furthermore as an example, each data group may have the characteristic of being piecewise linear.

In general in accordance with some embodiments, the SSO data collection techniques may provide an overall worst case data collection process from the device (e.g., PLD) die pad viewpoint, with the process extended to provide the package worst case condition. Furthermore as an example, the hardware data may be supplemented using simulation results to populate the data tables.

Specifically for one or more embodiments, the techniques disclosed herein may provide a comprehensive data generation methodology (SSO data collection techniques), with the data generated (e.g., hardware data collected and simulation data generated) used to construct the data tables, which are structured as defined by the SSO data structure techniques. Additionally in accordance with some embodiments, the SSO data structure techniques may provide a definition of the data table (i.e., the specified SSO data structure) to allow a design tool to extract the required information based on user input. Thus as an example, the SSO data collection and SSO data structure techniques may provide systems and methods to develop an SSO predictor tool either as a standalone (e.g., as a separate software program) or as part of the overall PLD design tool (e.g., software based PLD design tool).

For example in accordance with one or more embodiments of the present invention, the SSO data collection and SSO data structure techniques (e.g., as discussed previously in reference to FIGS. 2a and 2b) may be used to calculate an estimated SSO noise (e.g., worst case SSO noise) for a given PLD. The SSO noise calculation (e.g., worst case SSO noise calculation), for example, may be included as part of a standalone SSO noise calculator or as part of the overall PLD design tool.

Figure 3A:
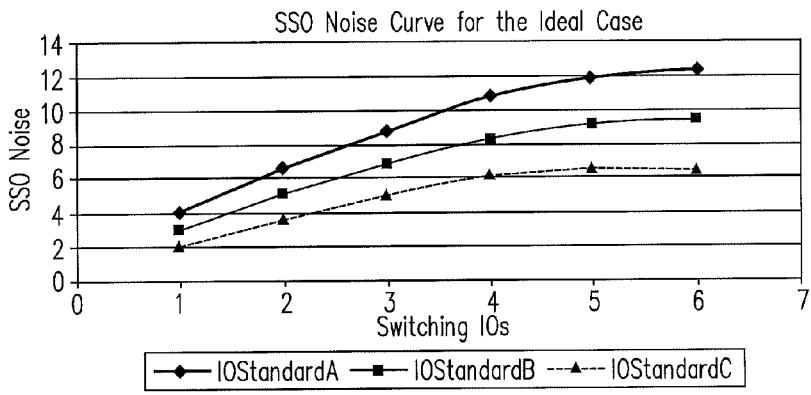
FIGS. 3a and 3b show plots of SSO noise for ideal and non-ideal examples, respectively, in accordance with an embodiment of the present invention.
Figure 3B:
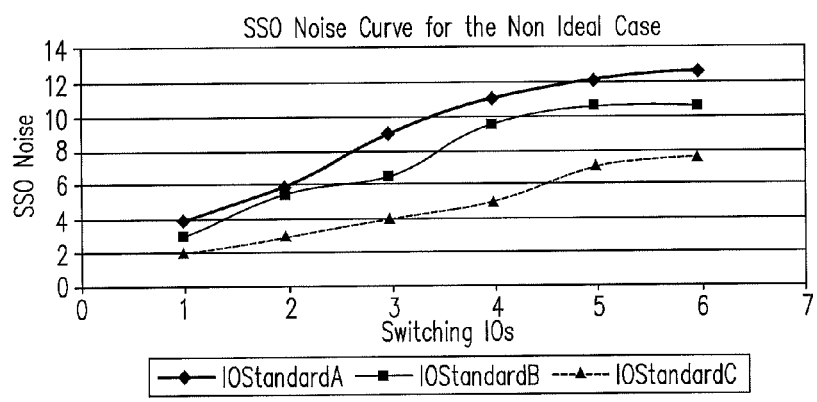

A conventional approach generally provides only an ideal SSO noise prediction and calculation (e.g., an ideal worst case data collection and calculation from a BGA package standpoint based on ideal data). However, as shown in the exemplary graphs of FIGS. 3a and 3b for ideal and non-ideal SSO noise, respectively, the non-ideal data (FIG. 3b) does not provide a smooth curve as is provided with the ideal data (FIG. 3a). For example, the non-ideal data may include PLD package data, which may include only certain I/Os bonded out, ground (GND) and supply voltage pads separate from SSO I/O pads, and/or SSO I/O drivers not perfectly balanced. Consequently, the SSO noise calculation based on ideal data (e.g., from the ideal curves of FIG. 3a) will generally be less accurate and lower than when using the non-ideal data (e.g., from the non-ideal curves of FIG. 3b).

Figure 4:
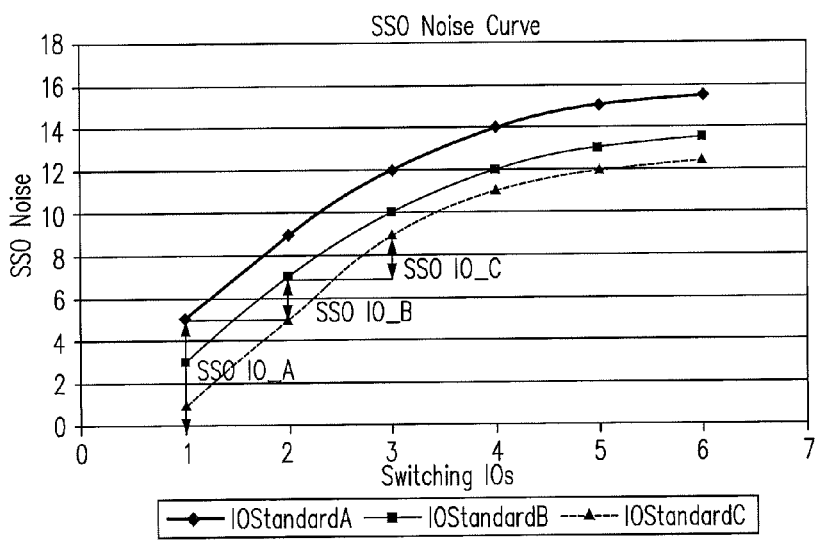
FIG. 4 shows an example of a plot of SSO noise versus the number of switches in accordance with an embodiment of the present invention.

For example, FIG. 4 shows an example of a plot of SSO noise versus the number of switches in accordance with an embodiment of the present invention. If the SSO noise curves are ideal, a conventional approach would calculate a total SSO noise level by simply summing the ideal data, as shown in FIG. 4.

In contrast in accordance with one or more embodiments of the present invention, an SSO noise calculation formula is disclosed, as shown as an example in equation (1), to provide a worst case data collection calculation. The formula as shown in equation (1) is for four I/O signal standards, but this is not limiting and the formula may be extended to apply for any number of I/O signal standards (e.g., I/OStandardMax(I/O_max)) as illustrated generally as an example in equation (2), as would be understood by one skilled in the art.

$$\text{SSO Noise} = \text{Max}[\text{I/OStandard1}(\text{I/O}\_1), \text{I/OStandard2}(\text{I/O}\_1), \text{I/OStandard3}(\text{I/O}\_1), \text{I/OStandard4}(\text{I/O}\_1)] + \text{Max}[(\text{I/OStandard1}(\text{I/O}\_2), \text{I/OStandard2}(\text{I/O}\_2), \text{I/OStandard3}(\text{I/O}\_2), \text{I/OStandard4}(\text{I/O}\_2)] + \ldots \text{Max}[(\text{I/OStandard1}(\text{I/O}\_\text{max}), \text{I/OStandard2}(\text{I/O}\_\text{max}), \text{I/OStandard3}(\text{I/O}\_\text{max}), \text{I/OStandard4}(\text{I/O}\_\text{max})] \qquad (1)$$

$$\text{SSO Noise} = \sum_{x=1}^{\infty} \max(\text{I/OStandard}n(\text{I/O}\_x)) \qquad (2)$$

where "n" and "x" each represent any desired number, depending upon the specific application, with the summation including the number of I/O signal Standards (e.g., the value of "n") for each value of "x" (e.g., I/O standard location) as set forth in equation (1).

As a general worst case SSO noise level example, FIG. 5a shows a number of tables illustrating an example of SSO noise data and SSO noise calculation results in accordance with an embodiment of the present invention. Specifically, FIG. 5a includes a table 502 of exemplary non-ideal SSO noise curve data (e.g., slope values of SSO noise curve data), where for this example there are a total of six I/Os. FIG. 5a further includes a table 504 and a table 508, which show SSO noise deltas for adding an additional I/O based on the data within table 502, along with corresponding tables 506 and 510, which show SSO noise calculation results (e.g., with this example assuming two of I/O Standard A, two of I/O Standard B, and two of I/O Standard C).

Tables 504 and 506 are provided as an example of a conventional algorithm approach for determining SSO noise, while tables 508 and 510 are provided as an example of an SSO algorithm approach for determining SSO noise in accordance with an embodiment of the present invention. Tables 504 and 508 provide the SSO noise delta if adding an I/O, with the highlighted values in tables 504 and 508 illustrating the placement of I/O signals away from the SSO victim pin and the selected values for the conventional algorithm and the disclosed SSO algorithm approach, respectively. As illustrated in tables 506 and 510 (e.g., worst case SSO calculation results), the conventional algorithm approach may not provide the worst case SSO noise result, while the SSO algorithm approach in accordance with one or more embodiments will take into account non-ideal data and produce the worst case SSO noise result (e.g., independent of the PLD data).

The formula of equation (1) (or (2)) may be used to calculate the worst case SSO noise calculation based on any type of SSO noise data (e.g., ideal or non-ideal SSO noise data, which may be bank based I/O signal data). Furthermore, the formula may be adapted to account for pin placement when calculating the SSO noise levels (e.g., worst case pin based SSO noise levels) and, thus, the worst case SSO noise level may be determined even though the PLD SSO noise data is non-ideal in accordance with an embodiment of the present invention.

For example in accordance with an embodiment, worst case pin based SSO analysis may be performed by determining how far each I/O signal is away from the SSO victim pin (e.g., rather than assuming the switching I/O signals are adjacent to the victim pin that is assumed to be at the edge of the SSO group or bank). For this distance determination as an example, supply voltage (Vcc) and ground (GND) pins not connected to the I/Os may be ignored, while I/O supply voltage ($V_{CCIO}$) and ground ($GND_{IO}$) pins may be included in determining distance away from the SSO victim pin, but without adding additional SSO noise due to these pins. The SSO noise per I/O based on the location may then be determined by summation of the SSO noise for the I/O. This process may be repeated for each I/O (e.g., treat each I/O as the victim pin). Thus, the I/O signal with the worst case associated SSO noise is identified as the victim pin, with this pin-based SSO analysis providing the worst case (pin based) SSO noise level result. As an example, the formula in equation (3) illustrates generally the summation per I/O signal for the pin based SSO noise level determination.

$$\text{SSO Noise} = \Sigma_{x=1}^{\infty} \text{I/OStandard} n(\text{I/O}\_x) \quad (3)$$

In accordance with an embodiment of the present invention, the SSO noise determination may further include package effects. For example, the pin based SSO noise level determination is based on the pin location on the die, but the die pins may be routed differently depending upon the type of die package used for the desired application. As a specific example, when the die pins are routed to the balls of a ball grid array (BGA) package, the wire lengths may differ due to the ball locations on the grid. Thus, a weighting factor may be included within the SSO noise calculation (e.g., the pin based SSO noise formula of equation (3)).

Figure 5B:
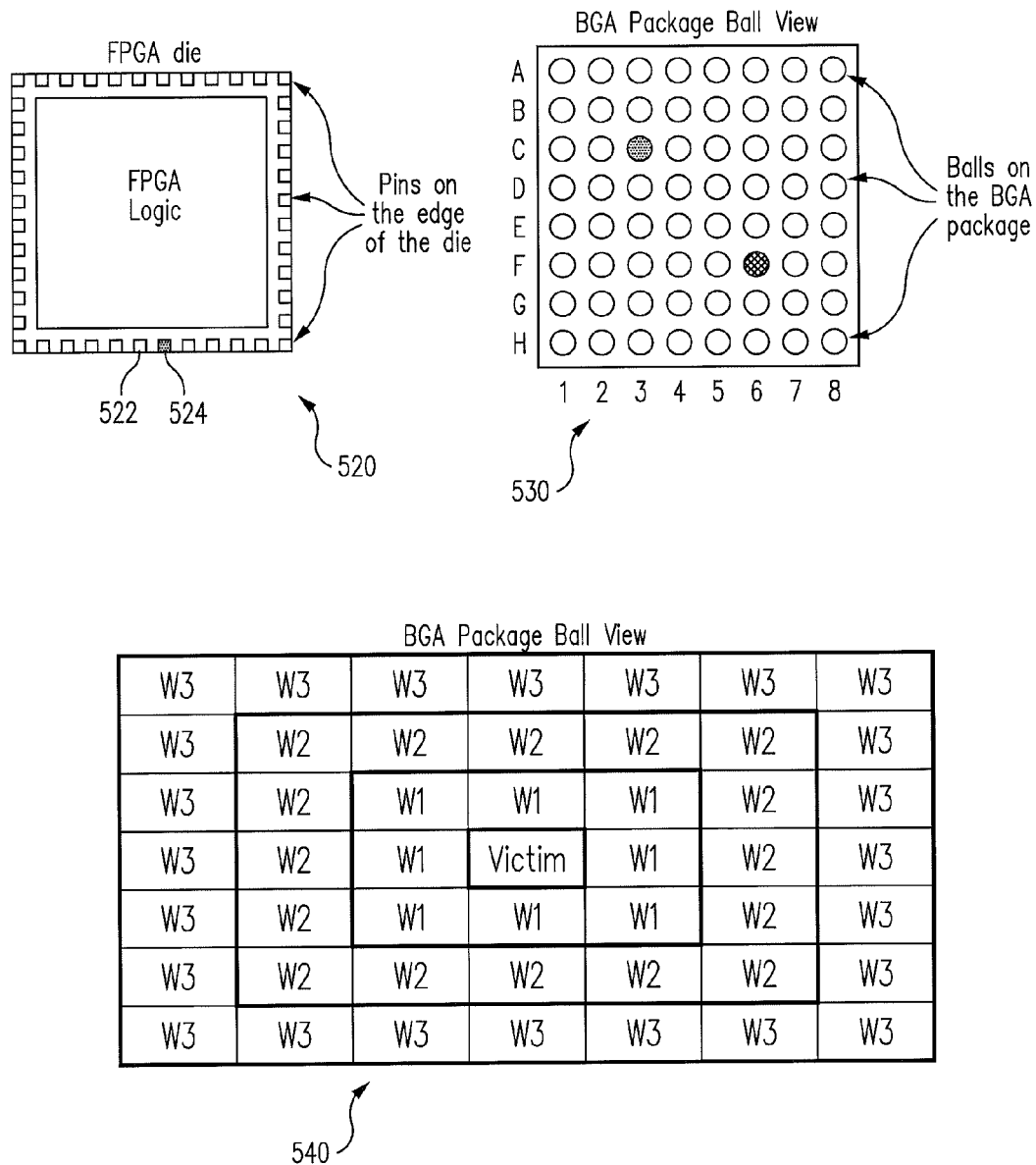
FIG. 5b shows an example of die pins, package terminals, and weighting parameters for SSO noise calculations in accordance with one or more embodiments of the present invention.

For example, FIG. 5b shows an example of a die 520 (e.g., an FPGA die), a package 530 (e.g., a BGA package ball view), and a package 540 (e.g., a BGA package ball view) with an example of weighting parameters for SSO noise calculations in accordance with one or more embodiments of the present invention. As shown in die 520 and package 530 as an example, die pins (e.g., die pins 522 and 524) may be located in close proximity to each other (e.g., adjacent), but when these die pins are routed to the package terminals (e.g., ball grid positions C3 and F6), their proximity may change significantly and the wire lengths may differ due to the routing distances between the die pin and the ball location on the package grid. For example, die pins 522 and 524 may represent worst case placement for SSO noise, while the actual SSO noise result may differ due to the actual pin placement on the package (e.g., for this example a reduction in SSO noise due to the increased spacing of ball grid positions C3 and F6 as compared to die pins 522 and 524).

Therefore in accordance with an embodiment, the pin based formula may be modified to include a package weighting factor. For example, as shown by package 540 of FIG. 5b, the package weighting factor may represent a distance (e.g., a measured distance) from the victim pin. As a specific example for package 540, the package weighting factor may vary from W1 (e.g., a value of one for a first distance) to W3 (e.g., a value of zero for a maximum distance for a desired application). As an example, the formula in equation (4) illustrates generally the summation per I/O signal for the pin based SSO noise level determination with weighting factors (Wx) applied to account for packaging effects.

$$\text{SSO Noise} = \Sigma_{x=1}^{\infty} \text{I/OStandard} n(\text{I/O}\_x) * Wx \quad (4)$$

In accordance with an embodiment of the present invention, the SSO noise determination may further take into account virtual grounds or power supplies. For example, the pin based SSO noise level (e.g., with weighting factors (Wx)) may include virtual signals to reduce SSO noise levels. Specifically, a virtual ground or power supply may represent a user I/O signal that is driven high or low (e.g., representing a virtual power supply or ground, respectively). Consequently, the pin based SSO noise formula may be modified to include virtual signals, which generally would reduce SSO noise, as illustrated for example in equation (5).

$$\text{SSO Noise} = \Sigma_{x=1}^{\infty} \text{I/OStandard} n(\text{I/O}\_x) * Wx - \Sigma_{x-1}^{\infty} \text{VirtualI/O} n(\text{I/O}\_x) * Wx \quad (5)$$

The formula set forth in equations (1) through (5) may be applied, for example, to non-ideal SSO noise data (slope values of SSO noise curves as discussed in reference to FIG. 5a). Thus, for example, the formula of equation (1) may be applied to the data structure tables of FIG. 2b by simply converting the data in these tables to SSO noise curve slope values, as would be understood by one skilled in the art.

The ability to quickly and accurately calculate SSO noise may provide certain advantages over conventional approaches. For example in accordance with one or more embodiments of the present invention, an I/O signal placement algorithm is disclosed that may automatically optimize the I/O signal assignments, for example, such that the SSO noise may be minimized (e.g., for a given PLD and its specific package). For example, the I/O signal placement algorithm may eliminate a conventional trial-and-error design process, which may greatly enhance the productivity of the PLD design process.

As an example, a conventional I/O signal placement process, in a PLD design placement and route process, typically is directed to achieving two goals, which are (1) to find a legal (valid) I/O signal placement solution for each I/O signal (e.g., to satisfy bank assignments and I/O voltage reference settings) and (2) to find a solution that will optimize the PLD design performance and/or meet any specific set of user design constraints. Thus, this conventional I/O signal placement process does not consider SSO noise issues during the PLD design flow process.

In contrast in accordance with one or more embodiments of the present invention, SSO noise minimization techniques are included as part of an I/O signal placement objective cost function. Consequently, when the final I/O signal placement solution is determined, the solution not only provides the I/O legal combination (e.g., satisfying bank assignments and I/O voltage reference settings), but may also be optimized to minimize SSO noise. Thus in accordance with an embodiment of the present invention, the I/O signal placement approach may be viewed as introducing the concept of "SSO Driven" for an I/O signal placement algorithm that may include bank based, pin based, package, and/or virtual signal factors (e.g., as discussed in reference to equations (1) through (5)).

In general in accordance with one or more embodiments, the I/O signal placement algorithm may be applied to an I/O bank level and/or a pin-based SSO noise model and thus, may provide a more efficient and accurate solution as compared to some conventional SSO noise calculator tools. Furthermore in accordance with one or more embodiments, the I/O signal placement algorithm may employ a table look-up and/or formula-based approach for determining SSO noise, which may allow the SSO noise calculation to be implemented as a cost function of a simulated annealing-based placement engine, as discussed further herein. For example, the I/O signal placement algorithm may utilize the data collection, data structure, and/or SSO noise calculation techniques disclosed herein, but this is not limiting as the I/O signal placement algorithm may utilize other table look-up and/or formula-based approaches for providing an SSO noise estimate, as would be understood by one skilled in the art.

For example, an effort level may be selected to control the weight of SSO noise relative to other optimization objectives during the simulated annealing process. Thus, a user may choose the desired balanced result between SSO noise minimization and other metrics (e.g., such as performance), based on the particular PLD design specifics. Furthermore in accordance with one or more embodiments, the SSO noise analysis results may be displayed within a PLD design package graphic viewer by seamlessly integrating the SSO noise calculation within a floor planning tool, as opposed to a conventional listing of the data in a table format, as would be understood by one skilled in the art.

Figure 6:
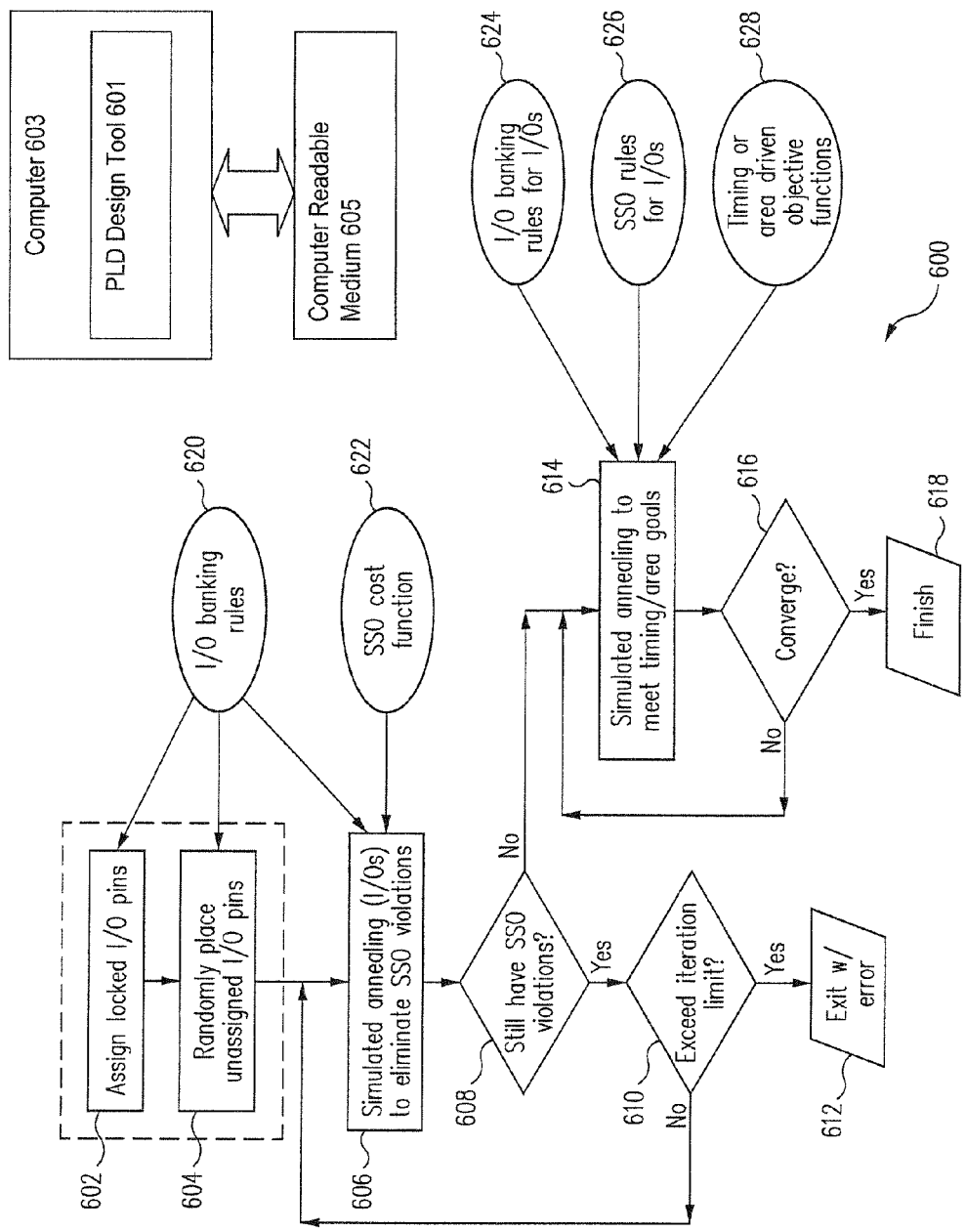
FIG. 6 shows a flowchart illustrating the incorporation of SSO noise data within a design tool in accordance with an embodiment of the present invention.

As a specific example, FIG. 6 shows a flowchart 600 illustrating the incorporation of SSO noise data within a PLD design tool in accordance with an embodiment of the present invention. For example, flowchart 600 may represent an I/O signal placement algorithm within a PLD design tool 601 (e.g., a software design tool such as a computer program for execution by a computer 603, which may be stored on a computer-readable medium 605), which may be used during the PLD design process and to generate configuration data and program the PLD.

Flowchart 600 includes an initial I/O signal placement, which may include the placement of all pre-assigned I/O signals to their locked pin locations (block 602). During the initial I/O signal placement, all unassigned I/O signals may be randomly assigned to any available I/O pins (block 604). The initial I/O signal placement may be adjusted or take into account, as required, the I/O banking rules (block 620).

A "simulated annealing" (SA) process may be performed (e.g., blocks 606, 608, and 610) for the randomly assigned I/O signals to eliminate violations to any SSO noise requirements. For example, the SA process may be similar or represent a conventional SA process (e.g., SA engine that factors in I/O banking rules (block 620)), but with the cost function modified to account for the SSO noise requirements (e.g., include SSO cost function (block 622) in the SA process).

As an example, by utilizing a table look-up and/or formula-based approach, the cost function for SSO noise violations may be computed rapidly, such that a number of iterations may be performed to find appropriate I/O signal assignments with no SSO noise violations. The SSO cost function (block 622) may penalize the I/O signals with SSO noise violations, with for example, the I/O signals that violate the SSO noise requirement receiving a higher cost, while the "legal" I/O signals (e.g., I/O signals that meet their SSO noise requirements) receiving a smaller cost.

As a specific example, for an I/O signal placement move with a cost change $(\Delta C) \leq 0$, the move may be accepted unconditionally, while an I/O signal placement move with a cost change $(\Delta C) > 0$, the probability (p) of the move being accepted may be determined as set forth in equation (6), where T represents temperature.

$$p = e^{-\Delta C/T} \tag{6}$$

The SA process may continue until no violations are found or, if the number of iterations exceeds a pre-defined number, the SA process may report an I/O signal placement failure (block 612). The SA process may continue further to meet additional objectives, such as timing/area goals (blocks 614 and 616), which may be subject to various conditions or cost functions (e.g., I/O banking rules for I/O signals (block 624), SSO rules for I/O signals (block 626), and/or timing or area driven objective functions (block 628)).

The PLD design tool may continue with the normal placement flow for all logic elements in the PLD design, as would be understood by one skilled in the art. However as an example, the move of an I/O signal and/or swaps between different I/O signals, which may violate SSO noise requirements, I/O banking rules, or other requirements (e.g., "illegal moves") may be prevented, therefore guaranteeing the legality of I/O signal placement during the entire PLD design process.

Systems and methods are disclosed herein to provide improved techniques directed to SSO noise, which may be applied during the PLD design process. For example, in accordance with an embodiment of the present invention, data collection and data structure techniques for SSO noise calculations for a PLD are disclosed. Furthermore in accordance with an embodiment of the present invention, the selection of SSO noise data for worst case I/O signal placement and SSO noise calculations are disclosed. Additionally in accordance with an embodiment of the present invention, an I/O signal placement algorithm is disclosed that may be used during the PLD design process to reduce SSO noise for PLD designs.

It should be understood that the various techniques disclosed herein (e.g., data collection and data structure techniques, SSO noise calculation techniques, and/or I/O signal placement design techniques) may be implemented within separate software applications or within a comprehensive PLD design tool. For example in accordance with an embodiment of the present invention, the techniques disclosed herein may be incorporated, as would be understood by one skilled in the art, as part of a PLD design tool (e.g., a software design tool such as a computer program for execution by a computer, which may be stored on a computer-readable medium), which may be used during the PLD design process and which may be used to generate configuration data and program the PLD.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A computer-method of performing input/output (I/O) signal placement to pins of an electronic device, the method comprising:
   in a software design tool executing on a computer:
      placing all pre-assigned I/O signals to their assigned pin locations;
      placing unassigned I/O signals to initial I/O pin locations; and
      performing a simulated annealing for the I/O signals placed at initial I/O pin locations, wherein the simulated annealing accounts for simultaneous switching output (SSO) noise requirements through an SSO cost function,
      wherein a probability of an I/O signal placement being moved from an initial I/O pin location is $p=e^{-\Delta C/T}$, where $\Delta C$ represents an increase in the SSO cost function and T represents temperature.

2. The method of claim 1, wherein the placing unassigned I/O signals to initial I/O pin locations is based on I/O banking rules.

3. The method of claim 1, wherein the performing of the simulated annealing is based on I/O banking rules and an SSO cost function.

4. The method of claim 1, wherein SSO noise calculations are performed based on a table lookup and/or a formula for the performing for comparison to the SSO noise requirements, and wherein the SSO noise calculations take into account die pin location, packaging, and/or one or more virtual signals.

5. The method of claim 1, wherein the performing the simulated annealing is repeated to eliminate SSO noise violations, with SSO noise calculations for the simulated annealing based on structured SSO noise data.

6. The method of claim 1, further comprising performing a second simulated annealing for timing and/or area goals.

7. The method of claim 1, further comprising performing a second simulated annealing for timing and/or area goals, wherein the second simulated annealing is further based on I/O banking rules and SSO noise I/O rules.

8. The method of claim 1, wherein the simulated annealing further accounts for I/O banking rules, timing goals, and/or area goals.

9. The method of claim 1, wherein the method is performed as part of a programmable logic device design tool, with the SSO noise data provided along with floor planning information.

10. The method of claim 1, further comprising:
    receiving hardware data on SSO noise conditions;
    generating additional data based on the hardware data; and
    providing the hardware data and the additional data for SSO noise calculations which are performed during the simulated annealing.

11. The method of claim 10, further comprising:
    storing the hardware data and the additional data in data tables, which are structured for the SSO noise calculations, and wherein the generating of at least a portion of the additional data is performed using computer simulations.

12. A non-transitory computer-readable medium on which is stored a computer program that when executed by a computer performs a method of input/output (I/O) signal placement to pins of an electronic device, the method comprising:
    placing all pre-assigned I/O signals to their assigned pin locations;
    placing unassigned I/O signals to initial I/O pin locations; and
    performing a simulated annealing for the I/O signals placed at initial I/O pin locations, wherein the simulated annealing accounts for simultaneous switching output (SSO) noise requirements through an SSO cost function,
    wherein a probability of an I/O signal placement being moved from an initial I/O pin location is $p=e^{-\Delta C/T}$, where $\Delta C$ represents an increase in the SSO cost function and T represents temperature.

13. The method of claim 12, wherein the performing of the simulated annealing is based on I/O banking rules and an SSO cost function.

14. The method of claim 12, wherein SSO noise calculations are performed based on a table lookup and/or a formula for the performing for comparison to the SSO noise requirements, and wherein the SSO noise calculations takes into account die pin location, packaging, and/or one or more virtual signals.

15. The method of claim 12, wherein the performing the simulated annealing is repeated to eliminate SSO noise violations, with SSO noise calculations for the simulated annealing based on structured SSO noise data.

16. The method of claim 12, further comprising performing a second simulated annealing for timing and/or area goals.

17. The method of claim 12, further comprising performing a second simulated annealing for timing and/or area goals, wherein the second simulated annealing is further based on I/O banking rules and SSO noise I/O rules.

18. The method of claim 12, wherein the simulated annealing further accounts for I/O banking rules, timing goals, and/or area goals.

19. The method of claim 12, wherein the method is performed as part of a programmable logic device design tool, with the SSO noise data provided along with floor planning information.

* * * * *